United States Patent
Lu et al.

(10) Patent No.: US 10,134,963 B2
(45) Date of Patent: Nov. 20, 2018

(54) PACKAGE STRUCTURE OF AN ULTRAVIOLET LIGHT EMITTING DIODE

(71) Applicant: Industrial Technology Research Institute, Hsinchu (TW)

(72) Inventors: Chien-Chun Lu, New Taipei (TW); Chen-Peng Hsu, Hsinchu (TW); Zhi-Wei Koh, Taichung (TW); Yen-Hsiang Fang, New Taipei (TW)

(73) Assignee: Industrial Techology Research Institute, Hsinchu (TW)

( * ) Notice: Subject to any disclaimer, the term of this patent is extended or adjusted under 35 U.S.C. 154(b) by 0 days.

(21) Appl. No.: 15/291,043

(22) Filed: Oct. 11, 2016

(65) Prior Publication Data
US 2017/0162767 A1 Jun. 8, 2017

(30) Foreign Application Priority Data
Dec. 4, 2015 (CN) .......................... 2015 1 0884181

(51) Int. Cl.
*H01L 33/58* (2010.01)
*H01L 33/48* (2010.01)

(52) U.S. Cl.
CPC ............ *H01L 33/58* (2013.01); *H01L 33/486* (2013.01)

(58) Field of Classification Search
USPC ........................................................ 257/98
See application file for complete search history.

(56) References Cited

U.S. PATENT DOCUMENTS

| 6,812,503 | B2 * | 11/2004 | Lin | H01L 33/483 257/100 |
| 8,896,078 | B2 * | 11/2014 | Kam | H01L 33/58 257/432 |
| 8,933,473 | B1 | 1/2015 | Dubin | |
| 9,496,470 | B2 * | 11/2016 | Ahn | H01L 33/60 |
| 2006/0284161 | A1 * | 12/2006 | Tokida | H01L 33/52 257/13 |

(Continued)

FOREIGN PATENT DOCUMENTS

| CN | 101079464 | 11/2007 |
| CN | 201539737 | 8/2010 |

(Continued)

OTHER PUBLICATIONS

Nelson et al., "Point-of-use water disinfection using UV light-emitting diodes to reduce bacterial contamination," Environmental Science and Pollution Research, Feb. 2013, pp. 1-8.

(Continued)

*Primary Examiner* — Sitaramarao S Yechuri
(74) *Attorney, Agent, or Firm* — JCIPRNET (57) ABSTRACT

A package structure of an ultraviolet light emitting diode is provided, which includes a substrate, a transparent body, at least one ultraviolet light emitting diode, a connecting element and an ultraviolet shielding layer. The transparent body is disposed on the substrate. The transparent body has a space inside thereof. The at least one ultraviolet light emitting diode is disposed on the substrate and inside the space. The connecting element is disposed between the substrate and the transparent body. The ultraviolet shielding layer is disposed between the transparent body and the connecting element.

20 Claims, 5 Drawing Sheets

(56) References Cited

U.S. PATENT DOCUMENTS

| | | | | |
|---|---|---|---|---|
| 2009/0008662 | A1* | 1/2009 | Ashdown | H01L 25/0753 |
| | | | | 257/98 |
| 2009/0239341 | A1* | 9/2009 | Yeh | H01L 21/50 |
| | | | | 438/118 |
| 2011/0001422 | A1* | 1/2011 | Aanegola | H01L 25/0753 |
| | | | | 313/501 |
| 2013/0234274 | A1 | 9/2013 | Hyuck et al. | |
| 2014/0021495 | A1* | 1/2014 | Li | F21S 10/02 |
| | | | | 257/88 |
| 2014/0367718 | A1* | 12/2014 | Park | H01L 33/486 |
| | | | | 257/98 |
| 2015/0155454 | A1* | 6/2015 | Doan | H01L 33/58 |
| | | | | 257/98 |
| 2015/0206861 | A1 | 7/2015 | Dubin | |
| 2016/0126426 | A1* | 5/2016 | Kim | H01L 33/486 |
| | | | | 257/98 |
| 2016/0190418 | A1* | 6/2016 | Inomata | H01L 33/507 |
| | | | | 257/98 |
| 2017/0114253 | A1* | 4/2017 | Nakayama | C09J 127/12 |

FOREIGN PATENT DOCUMENTS

| | | |
|---|---|---|
| CN | 101840977 | 9/2010 |
| CN | 102368496 | 3/2012 |
| CN | 102468407 | 5/2012 |
| CN | 102983245 | 3/2013 |
| CN | 103363355 | 10/2013 |
| CN | 204011471 | 12/2014 |
| CN | 204333010 | 5/2015 |
| TW | 200629600 | 8/2006 |
| TW | 200633264 | 9/2006 |
| TW | M377703 | 4/2010 |
| TW | 201517316 | 5/2015 |
| TW | 201527246 | 7/2015 |

OTHER PUBLICATIONS

Kollu et al., "Effect of particles and bioflocculation on ultraviolet disinfection of *Escherichia coli*," Water Research, Mar. 2012, pp. 750-760.

Miller et al., "Ultraviolet germicidal irradiation: future directions for air disinfection and building applications," Photochemistry and Photobiology, Mar. 28, 2013, pp. 771-781.

Hiroda et al., "Enhanced germicidal effects of pulsed UV-LED irradiation on biofilms," Journal of Applied Microbiology, Aug. 20, 2010, pp. 2183-2190.

Gijsman et al., "Comparison of the UV-degradation chemistry of polypropylene, polyethylene, polyamide 6 and polybutylene terephthalate," Polymer Degradation and Stability, Sep. 1999, pp. 433-441.

Maeder, "Review of Bi2O3-based glasses for electronics and related applications," International Materials Reviews, Nov. 12, 2013, pp. 3-40.

"Office Action of Taiwan Counterpart Application", dated Dec. 22, 2016, p. 1-p. 7.

"Office Action of Taiwan Counterpart Application," dated Jul. 25, 2017, p. 1-p. 7.

"Office Action of China Counterpart Application" , dated Jun. 19, 2018, p. 1-p. 10.

\* cited by examiner

PACKAGE STRUCTURE OF AN ULTRAVIOLET LIGHT EMITTING DIODE

CROSS-REFERENCE TO RELATED APPLICATION

This application claims the priority benefit of China application serial no. 201510884181.3, filed on Dec. 4, 2015. The entirety of the above-mentioned patent application is hereby incorporated by reference herein and made a part of this specification.

TECHNICAL FIELD

The technical field relates to a package structure of an ultraviolet light emitting diode.

BACKGROUND

Along with the improvement about the luminous efficiency of ultraviolet light emitting diodes, the rapid growth of related applications, such as water disinfection, air disinfection, foods disinfection, medical equipment, etc., the ultraviolet light emitting diodes are applied in the aforementioned fields.

In current technologies, the range of the optical output power of an ultraviolet light emitting diode is 1 mw to 10 mw. The optical output power of a package structure of an ultraviolet light emitting diode is 1 mw, and the package structure of the ultraviolet light emitting diode mainly adopts metal housing for gas tightness sealed. With the improvement of the optical output power of ultraviolet light emitting diode, how to design a package to meet higher requirements of light output power is what the researchers are anxious to solve.

SUMMARY

According to an embodiment of the disclosure, a package structure of an ultraviolet light emitting diode is provided. The package structure of the ultraviolet light emitting diode comprises a substrate, a transparent body, at least one ultraviolet light emitting diode, a connecting element and an ultraviolet shielding layer. The transparent body having a space inside thereof is disposed on the substrate. The at least one ultraviolet light emitting diode is disposed on the substrate and in the space. The connecting element is disposed between the substrate and the transparent body. The ultraviolet shielding layer is disposed between the transparent body and the connecting element.

According to another embodiment of the disclosure, a package structure of an ultraviolet light emitting diode is provided. The package structure of the ultraviolet light emitting diode comprises a recess substrate, a transparent body, at least one ultraviolet light emitting diode, a connecting element, and an ultraviolet shielding layer. The recess substrate has a space. The transparent body is disposed on the recess substrate. The at least one ultraviolet light emitting diode is disposed on the recess substrate and inside the space. The connecting element is disposed between the recess substrate and the transparent body. The ultraviolet shielding layer is disposed between the transparent body and the connecting element.

The foregoing will become better understood from a careful reading of a detailed description provided herein below with appropriate reference to the accompanying drawings.

DETAILED DESCRIPTION OF THE EMBODIMENTS

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The First Embodiment

Figure 1:
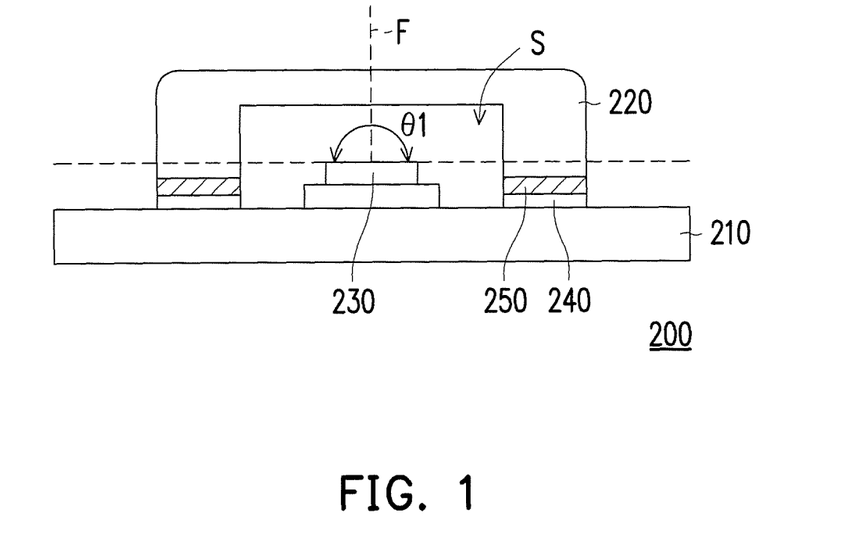
FIG. 1 is a schematic cross-sectional view of a package structure of an ultraviolet light emitting diode according to a first embodiment of the disclosure.

FIG. 1 is a schematic cross-sectional view of a package structure of an ultraviolet light emitting diode according to the first embodiment of the disclosure. Please refer to FIG. 1, the package structure of an ultraviolet light emitting diode 200 comprises a substrate 210, a transparent body 220, at least one ultraviolet light emitting diode 230, a connecting element 240, an ultraviolet shielding layer 250. The transparent body 220 is disposed on the substrate 210. The transparent body 220 has a space S inside thereof. The at least one ultraviolet light emitting diode 230 is disposed on the substrate 210 and in the space S. The connecting element 240 is disposed between the substrate 210 and the transparent body 220. The ultraviolet shielding layer 250 is disposed between the transparent body 220 and the connecting element 240.

Please refer to FIG. 1, a thermal conductive substrate may be adopted as the substrate 210. The thermal conductive substrate may be suitable for the at least one ultraviolet light emitting diode 230 of the high power (for example, larger than 3 mW), and may be suitable for a high-density flip-chip package of the at least one ultraviolet light emitting diode 230. That is, the substrate 210 may carry a plurality of the ultraviolet light emitting diodes 230. There is a narrow gap between two ultraviolet light emitting diodes 230 and the heat dissipation efficiency remains good.

Figure 2:
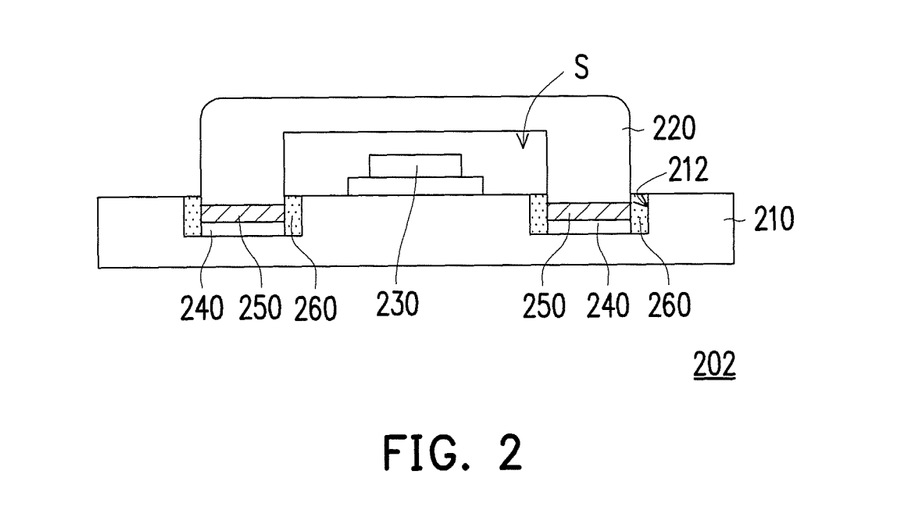
FIG. 2 is a schematic cross-sectional view of a package structure of an ultraviolet light emitting diode according to a second embodiment of the disclosure.

The materials of the transparent body 220 comprise quartz glass, or other suitable materials (materials do not absorb ultraviolet). The transparent body 220 may be the cover made of quartz glass. As shown in FIG. 2, when the transparent body 220 is adopted to package the at least one ultraviolet light emitting diode 230, the emitting ultraviolet from the at least one ultraviolet light emitting diode 230 may penetrate the transparent body 220, with a wider range of the light extraction angle.

In detail, the at least one ultraviolet light emitting diodes 230 may provide an ultraviolet (not shown) and penetrate the transparent body 220. The emitting angle θ1 of the ultraviolet has a range that goes from positive 90 degrees to negative 90 degrees relative to a normal direction F of a front surface of the at least one ultraviolet light emitting diode 230.

Compare the package technique for the ultraviolet light emitting diode adopted the metal cover with that mentioned in the embodiment of the disclosure, the transparent body 220 of the embodiment of the disclosure may have a wider range of the light extraction angle. It has a facility of the ultraviolet for extracting the light outside and the efficiency of the output power for the light is enhanced.

Moreover, compare the package technique for the ultraviolet light emitting diode adopted the polymer resin with that mentioned in the embodiment of the disclosure, the transparent body 220 of the embodiment of the disclosure may not absorb the ultraviolet and deteriorate. Thus, it may solve the deterioration problem of the polymer-resin package technique for the ultraviolet light emitting diode.

Please refer to FIG. 1 again, the space S inside the transparent body 220 is filled with gases. The gases may be inert gases and the space S becomes an inactive environment. Thus, the at least one ultraviolet light emitting diode 230 may be protected and the lifetime of the at least one ultraviolet light emitting diode 230 may be extended. As shown in FIG. 2, one ultraviolet light emitting diode 230 is illustrated, but a plurality of the ultraviolet light emitting diodes 230 may be disposed on the substrate 210 according to the output power of the design requirement to improve the light output power.

As shown in FIG. 2, the material of the connecting element 240 may be an adhesive material, such as a double-sided adhesive tape, resin, etc., may be used to connect the transparent body 220 to the substrate 210. Due to the ultraviolet shielding layer 250 disposed between the transparent body 220 and the connecting element 240, the damage of the connecting element 240 from the ultraviolet may be prevented. The material of the ultraviolet shielding layer 250 comprises metal, ceramic, borax glass or a combination thereof. When the material of the ultraviolet shielding layer 250 is metal, it may be gold or aluminum.

In addition, the ultraviolet transmittance of the transparent body 220 is greater than the ultraviolet transmittance of ultraviolet shielding layer 250. For instance, the ultraviolet transmittance of the transparent body 220 is greater than 80%, and the ultraviolet transmittance of the ultraviolet shielding layer 250 is less than 30%. Thus, the ultraviolet emitted from the ultraviolet light emitting diode 230 may drastically penetrate the transparent body 220 but may not penetrate the ultraviolet shielding layer 250. In the connection portion of the transparent body 220 and the substrate 210 (that is, the positions of the ultraviolet shielding layer 250 and the connecting element 240), the connecting element 240 may be protected by the ultraviolet shielding layer 250. It may avoid the deterioration of the connecting element 240 and ensure the airtight and waterproofing properties of the package structure of an ultraviolet light emitting diode 200.

In summary, the pace structure of an ultraviolet light emitting diode 200 has at least the following features. A high thermal conductive substrate may be adopted as the substrate 210 and the heat dissipation efficiency is good. The ultraviolet shielding layer 250 is utilized to avoid the deterioration of the connecting element 240 by the transmitted irradiating ultraviolet in the transparent body 220.

The Second Embodiment

FIG. 2 is a schematic cross-sectional view of a package structure of an ultraviolet light emitting diode according to the second embodiment of the disclosure. The package structure of the ultraviolet light emitting diode 202 shown in FIG. 2 is similar to the package structure of the ultraviolet light emitting diode 200 shown in FIG. 1, the same elements are labeled with the same element symbols.

The substrate 210 has a recess 212. The connecting element 240, the ultraviolet shielding layer 250 and a portion of the transparent body 220 are disposed in the recess 212. Thus, after passing through the connecting element 240 disposed in the recess 212, the ultraviolet emitted from the ultraviolet light emitting diode 230 may not irradiate the connecting element 240. It may avoid the deterioration of the connecting element 240 and improve the airtight and waterproofing properties of the package structure of an ultraviolet light emitting diode 202.

Please refer to FIG. 2, the package structure of an ultraviolet light emitting diode 202 further comprises a filler 260 disposed in the recess 212. Materials for blocking the ultraviolet may be adopted as the filler 260. Thus, the ultraviolet may not be incident to the connection part of the substrate 210 and the transparent body 220, and it may not influence the connecting element 240. The filler 260 also improves the connection strength of the connection part.

The package structure of an ultraviolet light emitting diode 202 of the second embodiment has the same properties of the package structure of an ultraviolet light emitting diode 200 of the first embodiment. The deterioration of the connecting element 240 may be avoided and the airtight and waterproofing properties of the package structure of an ultraviolet light emitting diode 202 may also be ensured.

The Third Embodiment

Figure 3:
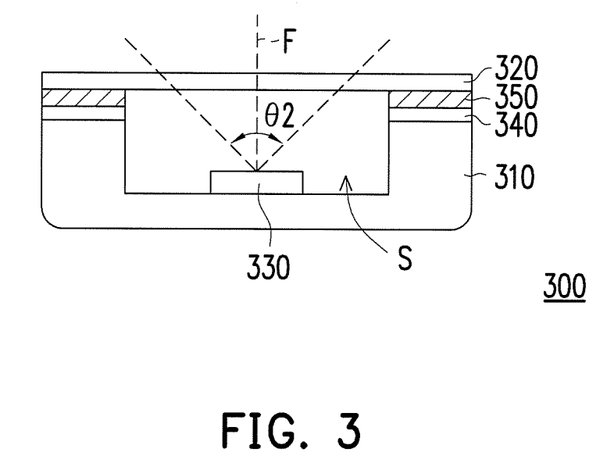
FIG. 3 is a schematic cross-sectional view of a package structure of an ultraviolet light emitting diode according to a third embodiment of the disclosure.

FIG. 3 is a schematic cross-sectional view of a package structure of an ultraviolet light emitting diode according to the third embodiment of the disclosure.

Please refer to FIG. 3, the package structure of an ultraviolet light emitting diode 300 comprises a recess substrate 310, a transparent body 320, at least one ultraviolet light emitting diode 330, a connecting element 340, an ultraviolet shielding layer 350. The recess substrate 310 has a space S. The transparent body 320 is disposed on the recess substrate 310. The at least one ultraviolet light emitting diode 330 is disposed on the recess substrate 310 and in the space S. The connecting element 340 is disposed between the recess substrate 310 and the transparent body 320. The ultraviolet shielding layer 350 is disposed between the transparent body 320 and the connecting element 340.

Please refer to FIG. 3, the recess substrate 310 has an upwardly open recess, and the at least one ultraviolet light emitting diode 330 is disposed on a bottom side of the interior in the recess substrate 310. Similarly, a thermal conductive substrate may be adopted as the recess substrate 310. According to the design requirement, a plurality of the ultraviolet light emitting diodes 330 may be disposed by a high-density arrangement (that is, there is a narrow gap between every two of the plurality of ultraviolet light emitting diodes.

The materials of the transparent body 320 comprise quartz glass, or other suitable materials. As shown in FIG. 3, the transparent body 320 may be a flat glass supported by the protruding portion of the recess substrate 310 on both sides. The connecting element 340 and the ultraviolet shielding layer 350 are disposed between the protruding portion of the recess substrate 310 and the transparent body 320.

Due to the ultraviolet transmittance of the transparent body 320 is greater than the ultraviolet transmittance of the ultraviolet shielding layer 350. The at least one ultraviolet light emitting diodes 330 may penetrate the transparent body 320 drastically but not penetrate the ultraviolet shielding layer 350. Thus, the connecting element 340 may be protected by the ultraviolet shielding layer 350 but not irradiate by the transmitted ultraviolet in the transparent body 320. It may avoid the deterioration of the connecting element 340 and ensure the airtight and waterproofing properties of the package structure of an ultraviolet light emitting diode 300.

The material of the connecting element 340 may be an adhesive material. The material of the ultraviolet shielding layer 350 comprises metal, ceramic, borax glass or a combination thereof. When the material of the ultraviolet shielding layer 350 is metal, it may be gold or aluminum.

Please refer to FIG. 3 again, the space S inside the recess substrate 310 is filled with gases. The gases may be inert gases and the space S becomes an inactive environment. Thus, the at least one ultraviolet light emitting diode 330 may be protected and the lifetime of the at least one ultraviolet light emitting diode 330 may be extended.

As shown in FIG. 3, the at least one ultraviolet light emitting diode 330 may provide an ultraviolet (not shown) and penetrate the transparent body 320. An emitting angle θ2 of the ultraviolet has a range that goes from positive 60 degrees to negative 60 degrees relative to the normal direction F of a front surface of the at least one ultraviolet light emitting diode 330. That is, the emitting angle θ2 of the ultraviolet has an emitting angle of 120 degrees.

Similarly, the package structure of an ultraviolet light emitting diode 300 has the following features: the high thermal conductive substrate may be adopted as the recess substrate 310 and the heat dissipation efficiency is good; the transparent body 320 has a large range of the light extraction angle and the efficiency of the output power for the light is enhanced; and the ultraviolet shielding layer 350 is utilized to avoid the deterioration of the connecting element 340 by the transmitted irradiating ultraviolet in the transparent body 320.

The Fourth Embodiment

Figure 4:
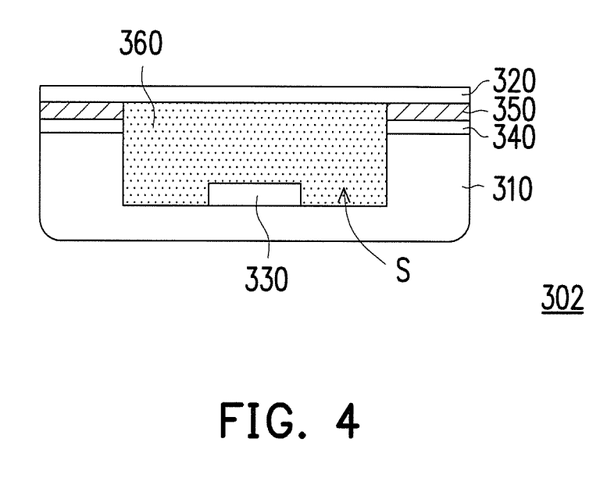
FIG. 4 is a schematic cross-sectional view of a package structure of an ultraviolet light emitting diode according to a fourth embodiment of the disclosure.

FIG. 4 is a schematic cross-sectional view of a package structure of an ultraviolet light emitting diode according to the fourth embodiment of the disclosure. The package structure of the ultraviolet light emitting diode 302 shown in FIG. 4 is similar to the package structure of the ultraviolet light emitting diode 300 shown in FIG. 3, the same elements are labeled with the same element symbols.

Please refer to FIG. 4, the package structure of the ultraviolet light emitting diode 302 further comprises a light extraction material disposed in the space S of the recess substrate 310.

The light extraction material 360 may include gas, silicon oil, silicon gel, methyl silicone or a combination thereof. The refraction index of the light extraction material 360 may be greater than 1.4, and the ultraviolet transmittance of the light extraction material 360 may be greater than 70%.

The light extraction material 360 filled in the space S may improve the light extraction efficiency of the ultraviolet. The light extraction material 360 may protect the ultraviolet light emitting diode 330. It may avoid the water or the oxygen entering the space S and damaging the at least one ultraviolet light emitting diode 330.

The package structure of the ultraviolet light emitting diode 302 in the fourth embodiment has the same feature as the package structure of the ultraviolet light emitting diode 300 of the third embodiment. Besides, the light extraction material 360 is utilized to improve the light extraction efficiency of the ultraviolet. It may avoid the water or the oxygen to influence the at least one ultraviolet light emitting diode 330.

The Fifth Embodiment

Figure 5:
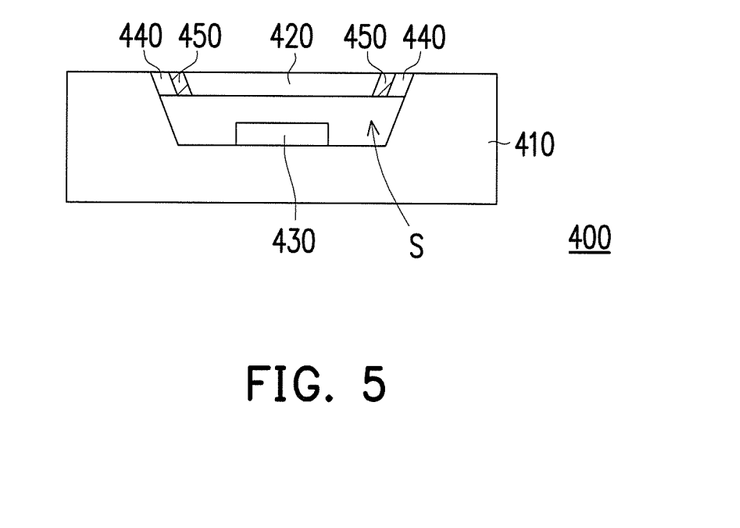
FIG. 5 is a schematic cross-sectional view of a package structure of an ultraviolet light emitting diode according to a fifth embodiment of the disclosure.

FIG. 5 is a schematic cross-sectional view of a package structure of an ultraviolet light emitting diode according to the fifth embodiment of the disclosure. Please refer to FIG. 5, the package structure of the ultraviolet light emitting diode 400 comprises a recess substrate 410, a transparent body 420, at least one ultraviolet light emitting diode 430, a connecting element 440, and an ultraviolet shielding layer 450. The recess substrate 410 has a space S. The transparent body 420 is disposed on the recess substrate 410. The ultraviolet light emitting diode 430 is disposed on the recess substrate 410 and in the space S. The connecting element 440 is disposed between the recess substrate 410 and the transparent body 420. The ultraviolet shielding layer 450 is disposed between the transparent body 420 and the connecting element 440.

Please refer to FIG. 5, the recess substrate 410 has an inclined plane and the recess substrate 410 is opaque. The transparent body 420 is embedded in the space S of the recess substrate 410, and the overall thickness of the package structure of the ultraviolet light emitting diode 400 may be reduced.

Similarly, the package structure of an ultraviolet light emitting diode 400 has the following features: a high thermal conductive substrate may be adopted as the recess substrate 410 and the heat dissipation efficiency is good; the transparent body 420 has a large range of the light extraction angle and the efficiency of the output power for the light is enhanced; and the ultraviolet shielding layer 450 is utilized to avoid the deterioration of the connecting element 440 by the transmitted irradiating ultraviolet in the transparent body 320.

The above-mentioned embodiments from the first to the fifth, the package structures of an ultraviolet light emitting diode, 200, 202, 300, 302, and 400, may be applied to a high-power (>3 mW) ultraviolet light emitting diode. The conventional heat dissipation problem of the high-power ultraviolet light emitting diode, the packaging defect problem resulted from material deterioration, and lacking of a light extraction angle with an enough large range etc., may be solved by the embodiments of the disclosure. The embodiments from the first to the fifth of the disclosure have the features-such as good heat dissipation efficiency, more complete package structure (with airtight and waterproofing properties), having a wider-range light extraction angle (improving the light extraction efficiency), and so on.

Figure 6:
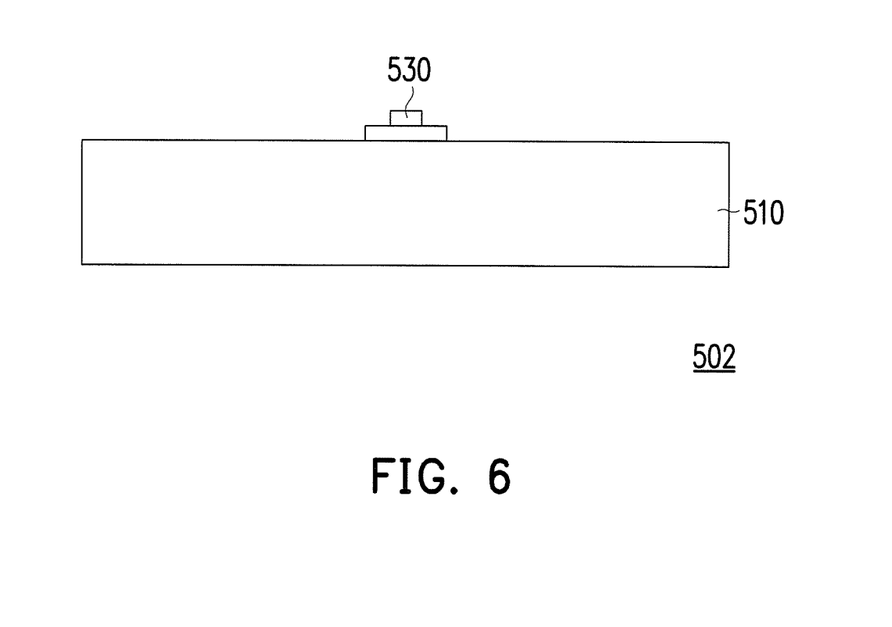
FIG. 6 is a schematic cross-sectional view of a non-package structure of an ultraviolet light source.
Figure 7:
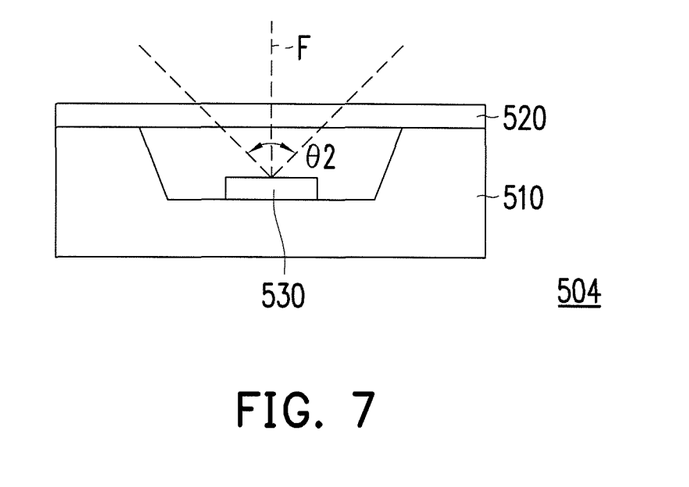
FIG. 7 is a schematic cross-sectional view of an ultraviolet light source with a reflector according to the first embodiment of the disclosure.
Figure 8:
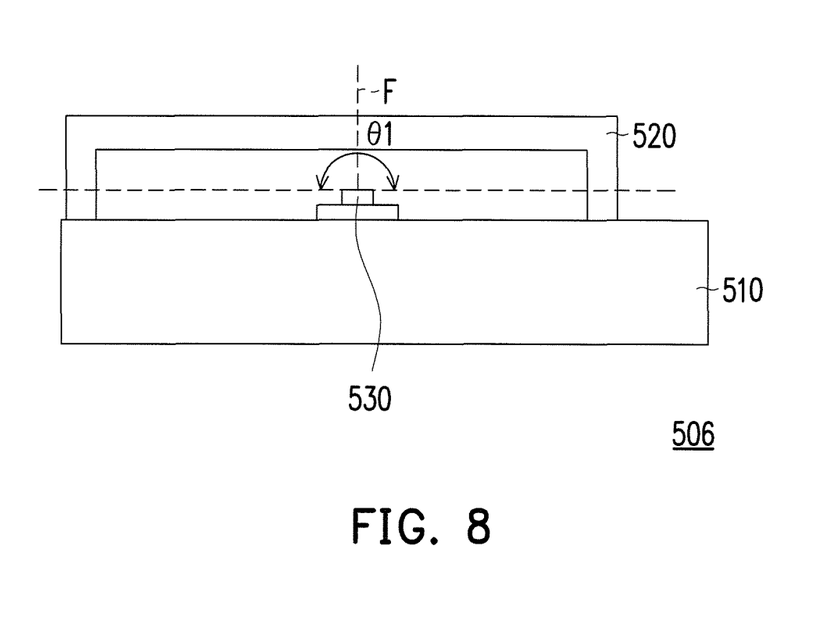
FIG. 8 is a schematic cross-sectional view of an ultraviolet light source with a transparent body according to an embodiment of the disclosure.

Different light extraction efficiencies of different package structures are illustrated, by utilizing an optical simulation. FIG. 6 is a schematic cross-sectional view of a non-package structure of an ultraviolet light source. FIG. 7 is a schematic cross-sectional view of an ultraviolet light source with a reflector according to the first embodiment of the disclosure. FIG. 8 is a schematic cross-sectional view of an ultraviolet light source with a transparent body according to the embodiment of the disclosure. The depicting of the connecting element and the ultraviolet shielding layer are omitted in FIG. 8.

Refer to FIG. 6 to FIG. 8 at the same time, an ultraviolet light source 502 in FIG. 6 has a substrate 510 and an ultraviolet light emitting diode 530. Because the ultraviolet light source 502 has no package structure, the light extraction efficiency of the ultraviolet light source 502 is 100%, according to the optical simulation.

An ultraviolet light source 504 in FIG. 7 has the substrate 510 (reflector), the transparent body 520 (that is, the transparent substrate) and the ultraviolet light emitting diode 530. Because the emitting angle θ2 of the ultraviolet is limited, the light extraction efficiency of the ultraviolet light source 504 with a package structure is 73%, according to the optical simulation.

An ultraviolet light source 506 in FIG. 8 has the substrate 510, the transparent body 520 and the ultraviolet light emitting diode 530. Because the emitting angle θ1 of the ultraviolet is a large-range angle of 180 degrees, the light extraction efficiency of the ultraviolet light source 506 is 84%, according to the optical simulation. Compare the reflector or the metal housing with the package structure of an ultraviolet light emitting diode, the embodiment in FIG. 8 of the disclosure may improve the light extraction efficiency.

The Sixth Embodiment

Figure 9:
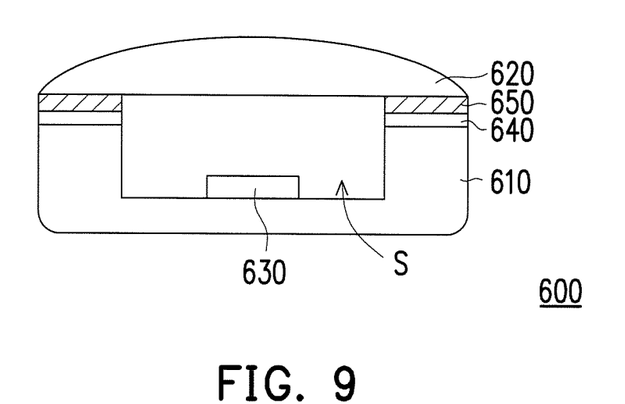
FIG. 9 is a schematic cross-sectional view of a package structure of an ultraviolet light emitting diode according to a six embodiment of the disclosure.

FIG. 9 is a schematic cross-sectional view of a package structure of an ultraviolet light emitting diode according to the six embodiment of the disclosure. Please refer to FIG. 9, the package structure of an ultraviolet light emitting diode 600 comprises: a recess substrate 610, a transparent body 620, at least one ultraviolet light emitting diode 630, a connecting element 640, and an ultraviolet shielding layer 650. The recess substrate 610 has a space S. The transparent body 620 is disposed on the recess substrate 610. The at least one ultraviolet light emitting diode 630 is disposed on the recess substrate 610 and in the space S. The connecting element 640 is disposed between the recess substrate 610 and the transparent body 620. The ultraviolet shielding layer 650 is disposed between the transparent body 620 and the connecting element 640.

As shown in FIG. 9, the ultraviolet shielding layer 650 is disposed in a position of packaging for the package structure of an ultraviolet light emitting diode 600, and the damage of the ultraviolet to the connecting element 640 may be reduced. The material of the ultraviolet shielding layer 650 comprises metal, ceramic, and so on. The feature of the package structure of an ultraviolet light emitting diode 600 is that the ultraviolet shielding layer 650 is in a position of connecting the transparent body 620, therefore it may solve the damage problem of the ultraviolet to the connecting element 640.

The transparent body 620 may comprise a lens. For example, as shown in FIG. 9, the transparent body 620 may utilize a convex lens to focus the ultraviolet. But it the scope of the disclosure is not limited thereto. The light shape of the transparent body 620 may be designed and modulated according to the demand. The transparent body 620 may utilize other suitable-shape lens, such as a concave lens.

The Seventh Embodiment

Figure 10:
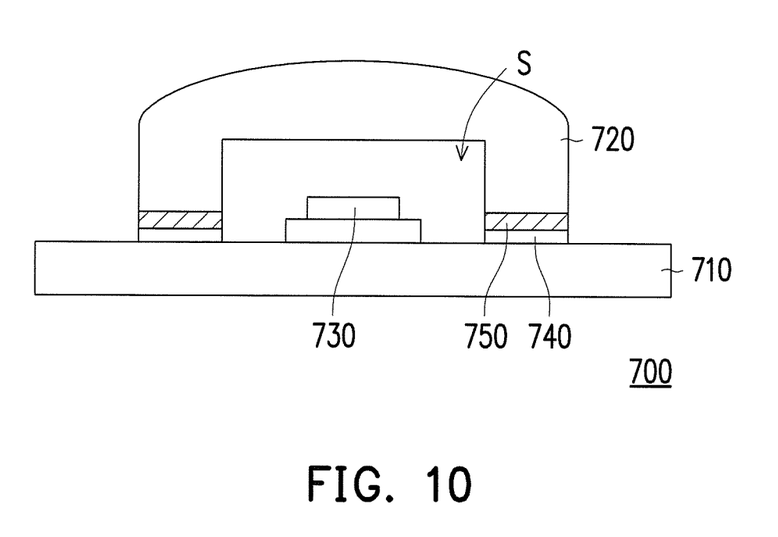
FIG. 10 is a schematic cross-sectional view of a package structure of an ultraviolet light emitting diode according to a seventh embodiment of the disclosure.

FIG. 10 is a schematic cross-sectional view of a package structure of an ultraviolet light emitting diode according to the seventh embodiment of the disclosure. Please refer to FIG. 10, the package structure of an ultraviolet light emitting diode 700 comprises a substrate 710, a transparent body 720, at least one ultraviolet light emitting diode 730, a connecting element 740, and an ultraviolet shielding layer 750. The transparent body 720 is disposed on the substrate 710. The transparent body 720 has a space S inside thereof. The at least one ultraviolet light emitting diode 730 is disposed on the substrate 710 and inside the space S. The connecting element 740 is disposed between the substrate 710 and the transparent body 720. The ultraviolet shielding layer 750 is disposed between the transparent body 720 and the connecting element 740.

As shown in FIG. 10, the ultraviolet shielding layer 750 is disposed in the package structure of an ultraviolet light emitting diode 700, and the damage of the ultraviolet to the connecting element 740 may be reduced. The material of the ultraviolet shielding layer 750 comprises metal, ceramic, and so on. The feature of the package structure of an ultraviolet light emitting diode 700 is that the ultraviolet shielding layer 750 is in a position of connecting the transparent body 720, therefore it may solve the damage problem of the ultraviolet to the connecting element 740.

The transparent body 720 may comprise a lens. For example, as shown in FIG. 10, an upper portion of the transparent body 720 may be convex-shaped. The transparent body 720 may utilize the convex-shaped portion to focus the ultraviolet. But the scope of the disclosure is not limited thereto. The light shape of the transparent body 720 may be designed and modulated according to the demand. The transparent body 720 may utilize other suitable-shape lens, such as a concave lens.

According to the various embodiments described above, the package structure of an ultraviolet light emitting diode comprises the following features: utilizing the transparent body (that is, the lens or the cover is made of the quartz glass) to package the at least one ultraviolet light emitting diode may get good waterproofing properties and reduce the water or oxygen damaging the at least one ultraviolet light emitting diode; and a wider range of the light extraction angle is reached and improves the light extraction efficiency. Besides, the ultraviolet shielding layer is utilized and it may reduce the damage of the ultraviolet to the connecting element, thereby ensuring the completeness of the package structure of an ultraviolet light emitting diode.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A package structure of an ultraviolet light emitting diode, comprising:
   a substrate;

a transparent body, disposed on the substrate, and having a space inside thereof;

at least one ultraviolet light emitting diode, disposed on the substrate and in the space, configured to provide an ultraviolet penetrating the transparent body, and an emitting angle of the ultraviolet has a range that goes from positive 90 degrees to negative 90 degrees relative to a normal direction of a front surface of the at least one ultraviolet light emitting diode;

a connecting element, comprised of resin, disposed between the substrate and the transparent body; and an ultraviolet shielding layer, disposed between the transparent body and the connecting element, wherein a width of the ultraviolet shielding layer is equal to a width of the transparent body.

2. The package structure of an ultraviolet light emitting diode as recited in claim 1, wherein the substrate has a recess, and wherein the connecting element, the ultraviolet shielding layer and a portion of the transparent body are disposed in the recess.

3. The package structure of an ultraviolet light emitting diode as recited in claim 2, further comprising:
a filler, disposed in the recess.

4. The package structure of an ultraviolet light emitting diode as recited in claim 1, wherein a material of the transparent body is quartz glass.

5. The package structure of an ultraviolet light emitting diode as recited in claim 1, wherein the space is filled with inert gas.

6. The package structure of an ultraviolet light emitting diode as recited in claim 1, wherein at least one material of the ultraviolet shielding layer includes metal, ceramic, borax glass or a combination thereof.

7. The package structure of an ultraviolet light emitting diode as recited in claim 1, wherein a material of the connecting element is an adhesive material.

8. The package structure of an ultraviolet light emitting diode as recited in claim 1, wherein an ultraviolet transmittance of the transparent body is greater than the ultraviolet transmittance of the ultraviolet shielding layer.

9. The package structure of an ultraviolet light emitting diode as recited in claim 1, wherein the transparent body comprises a lens.

10. A package structure of an ultraviolet light emitting diode, comprising:
a recess substrate, having a space;
a transparent body, disposed on the recess substrate;
at least one ultraviolet light emitting diode, disposed on the recess substrate and inside the space;
a connecting element, comprised of resin, disposed between the recess substrate and the transparent body; and
an ultraviolet shielding layer, disposed between the transparent body and the connecting element, wherein the connecting element and the ultraviolet shielding layer are disposed between protruding portion of the recess substrate and the transparent body, wherein a width of the ultraviolet shielding layer is equal to a width of the protruding portion of the recess substrate.

11. The package structure of an ultraviolet light emitting diode as recited in claim 10, wherein a material of the transparent body is quartz glass.

12. The package structure of an ultraviolet light emitting diode as recited in claim 10, wherein the space is filled with inert gas.

13. The package structure of an ultraviolet light emitting diode as recited in claim 10, wherein at least one material of the ultraviolet shielding layer includes metal, ceramic, borax glass or a combination thereof.

14. The package structure of an ultraviolet light emitting diode as recited in claim 10, wherein the ultraviolet light emitting diode is configured to provide an ultraviolet penetrating the transparent body, and an emitting angle of the ultraviolet has a range that goes from positive 90 degrees to negative 90 degrees relative to a normal direction of a front surface of the at least one ultraviolet light emitting diode.

15. The package structure of an ultraviolet light emitting diode as recited in claim 10, wherein a material of the connecting element is an adhesive material.

16. The package structure of an ultraviolet light emitting diode as recited in claim 10, wherein an ultraviolet transmittance of the transparent body is greater than the ultraviolet transmittance of the ultraviolet shielding layer.

17. The package structure of an ultraviolet light emitting diode as recited in claim 10, further comprising:
at least one light extraction material, disposed in the space of the recess substrate.

18. The package structure of an ultraviolet light emitting diode as recited in claim 17, wherein the at least one light extraction material includes silicon oil, silicon gel, methyl silicone or a combination thereof.

19. The package structure of an ultraviolet light emitting diode as recited in claim 10, wherein the transparent body comprises a lens.

20. A package structure of an ultraviolet light emitting diode, comprising:
a recess substrate, having a space;
a transparent body, disposed on the recess substrate;
at least one ultraviolet light emitting diode, disposed on the recess substrate and inside the space;
a connecting element, disposed between the recess substrate and the transparent body; and
an ultraviolet shielding layer, disposed between the transparent body and the connecting element, wherein the recess substrate having an inclined plane is opaque and the transparent body is embedded in the space of the recess substrate,
wherein top surfaces of the transparent body, the ultraviolet shielding layer and the connecting element are leveled, and
bottom surfaces of the transparent body, the ultraviolet shielding layer and the connecting element are leveled.

* * * * *